United States Patent
Kannengiesser

(10) Patent No.: US 9,568,577 B2
(45) Date of Patent: Feb. 14, 2017

(54) MAGNETIC RESONANCE METHOD AND APPARATUS FOR GENERATING AN IMAGE OF A SUBJECT WITH TWO SPIN SPECIES

(71) Applicant: Stephan Kannengiesser, Wuppertal (DE)

(72) Inventor: Stephan Kannengiesser, Wuppertal (DE)

(73) Assignee: Siemens Aktiengesellschaft, Munich (DE)

( * ) Notice: Subject to any disclaimer, the term of this patent is extended or adjusted under 35 U.S.C. 154(b) by 769 days.

(21) Appl. No.: 14/013,143

(22) Filed: Aug. 29, 2013

(65) Prior Publication Data

US 2014/0062479 A1    Mar. 6, 2014

(30) Foreign Application Priority Data

Aug. 29, 2012 (DE) .......................... 10 2012 215 299

(51) Int. Cl.
*G01R 33/48* (2006.01)

(52) U.S. Cl.
CPC ................................. *G01R 33/4828* (2013.01)

(58) Field of Classification Search
CPC .. G01R 33/4828; G01R 33/56; G01R 33/5607
See application file for complete search history.

(56) References Cited

U.S. PATENT DOCUMENTS

| | | | |
|---|---|---|---|
| 7,888,936 B2 | 2/2011 | Jellus | |
| 7,924,003 B2 | 4/2011 | Yu et al. | |
| 8,000,769 B2 | 8/2011 | Yu et al. | |
| 2007/0285094 A1* | 12/2007 | Reeder | G01R 33/4828 324/307 |
| 2012/0316795 A1 | 12/2012 | Eggers | |

OTHER PUBLICATIONS

Dixon, "Simple Proton Spectroscopic Imaging", Radiology, vol. 153, pp. 184-194, (1984).
Glover et al., "Three-Point Dixon Technique for True Water/Fat Decomposition with Bo Inhomogeneity Correction", in: Magn. Reson. Medicine, vol. 18, pp. 371-383, (1991).
Hernando et al.., "Chemical Shift-Based Water/Fat Separation: A Comparison of Signal Models", in Magnetic Resonance in Medicine, vol. 64, pp. 811-822, (2010).

(Continued)

*Primary Examiner* — Gregory H Curran

(74) *Attorney, Agent, or Firm* — Schiff Hardin LLP

(57) ABSTRACT

In a method and apparatus to determine a magnetic resonance image of an examination subject with at least two spin species by using a chemical shift imaging multi-echo MR measurement sequence, first approximated MR image is determined based on a first approximative model and of a second approximated MR image is determined based on a second approximative model, wherein the first and second approximative model respectively express an MR signal under consideration of one or more MR parameters, and wherein the first and second approximative model differ with regard to the consideration of at least one MR parameter. The MR image is determined from a mean calculation that depends on the first and second approximated MR image.

13 Claims, 4 Drawing Sheets

(56) References Cited

OTHER PUBLICATIONS

Bydder et al.., "Relaxation Effects in the Quantification of Fat using Gradient Echo Imaging", in: Magn. Reson. Imagin., vol. 26, No. 3, pp. 347-359, (2008).
Meisamy et al., "Quantification of Hepatic Steatosis with T1-independent, T2*-corrected MR Imaging with Spectral Modeling of Fat: Blinded Comparison with MR Spectroscopy"; in Radiology, vol. 258, No. 3, pp. 767-775, (2011).
Saranathan et al., "Ultra high spatio-temporal resolution liver imaging using a new view ordering scheme and a 2-point Dixon acquisition"; in: Proc. Intl. Soc. Mag. Reson. Med., vol. 19, p. 2941 (2011).
Liu Chia-Ying et al., "Fat Quantification With IDEAL Gradient Echo Imaging: Correction of Bias From T1 and Noise", in: Magn. Reson. Medicine, vol. 58, pp. 354-364, (2007).
Skinner et al., "An Extended Two-Point Dixon Algorithm for Calculating Separate Water, Fat, and Bo Images"; in Images in Mag. Res. Med. 37 628-630, (1997).
Jingfei MA, "Breath-Hold Water and Fat Imaging Using a Dual-Echo Two-Point Dixon Technique With an Efficient and Robust Phase-Correction Algorithm", Magnetic Resonance in Medicine, 52, pp. 415-419 (2004).
Berglund J. et al.,"Three-Dimensional Water/Fat Separation and T*2 Estimation Based on Whole-Image Optimization-Application in Breathhold Liver Imaging at 1.5T", Magnetic Resonance in Medicine; vol. 67; pp. 1684-1693; (2012).
Chebrolu V. V. et al. ,"Independent Estimation of T*2 for Water and Fat for Improved Accuracy of Fat Quantification", Magnetic Resonance in Medicine; vol. 63; pp. 849-857; (2010).
Hernando et al., R2 Mapping in the Presence of Macroscopic B0 Field Variations, Magnetic Resonance in Medicine, vol. 68 pp. 830-840 (2012).

* cited by examiner

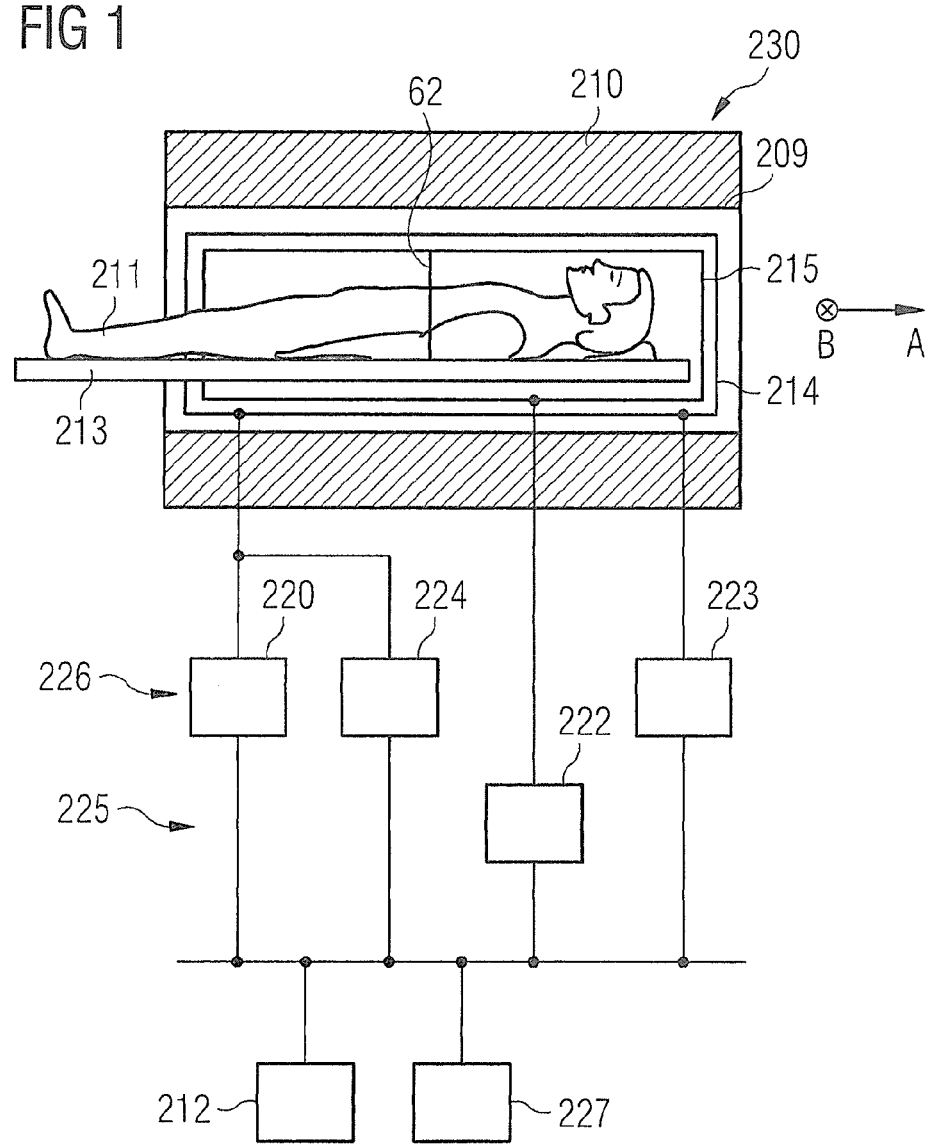

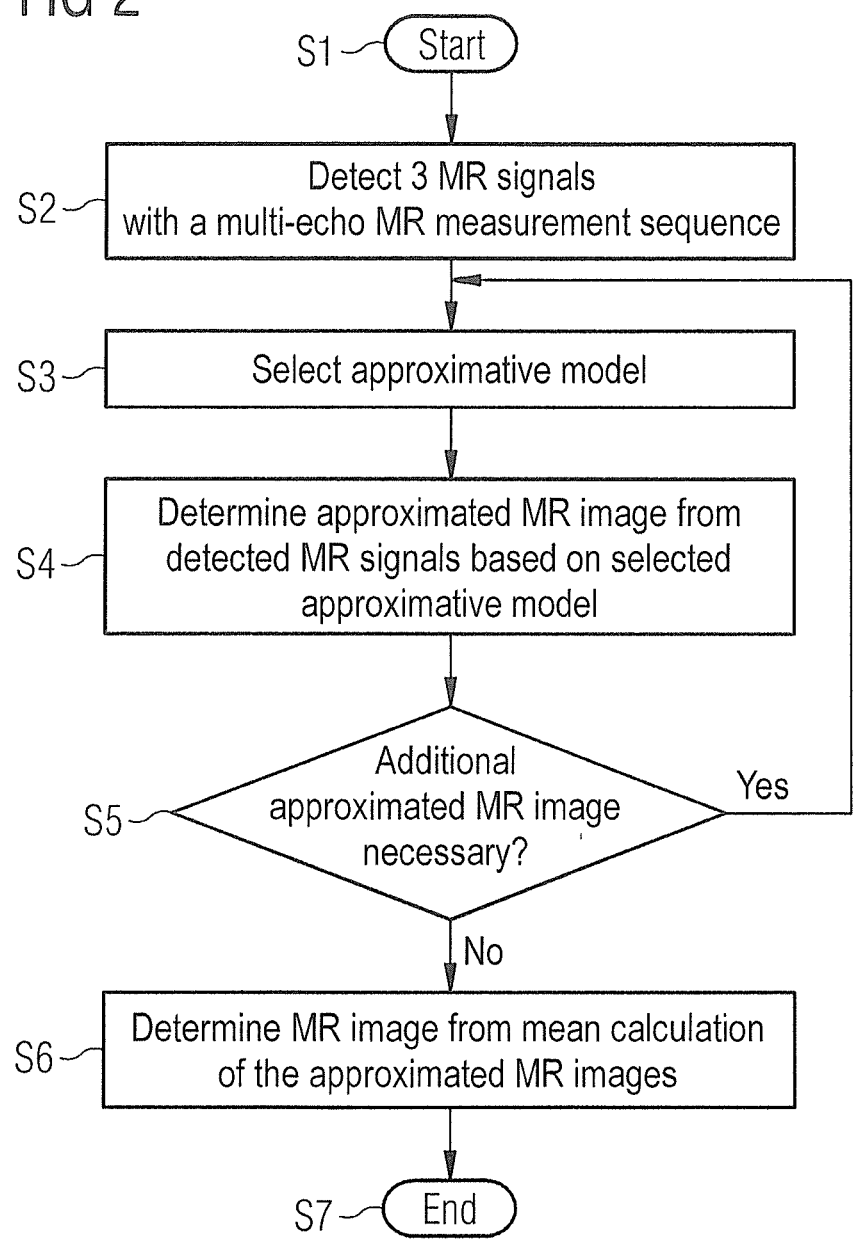

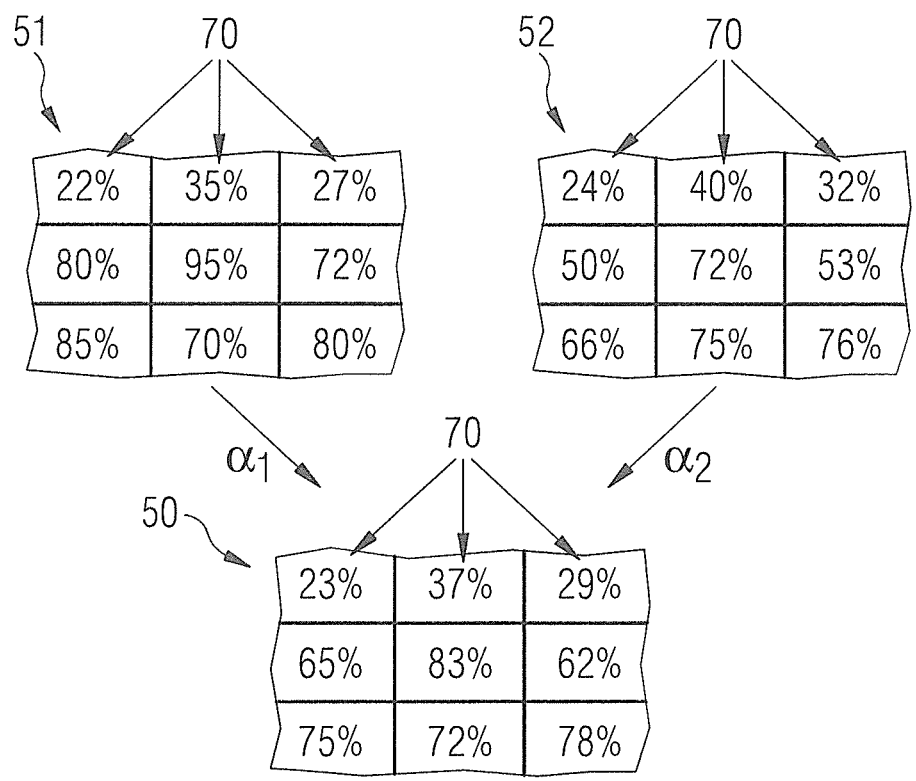

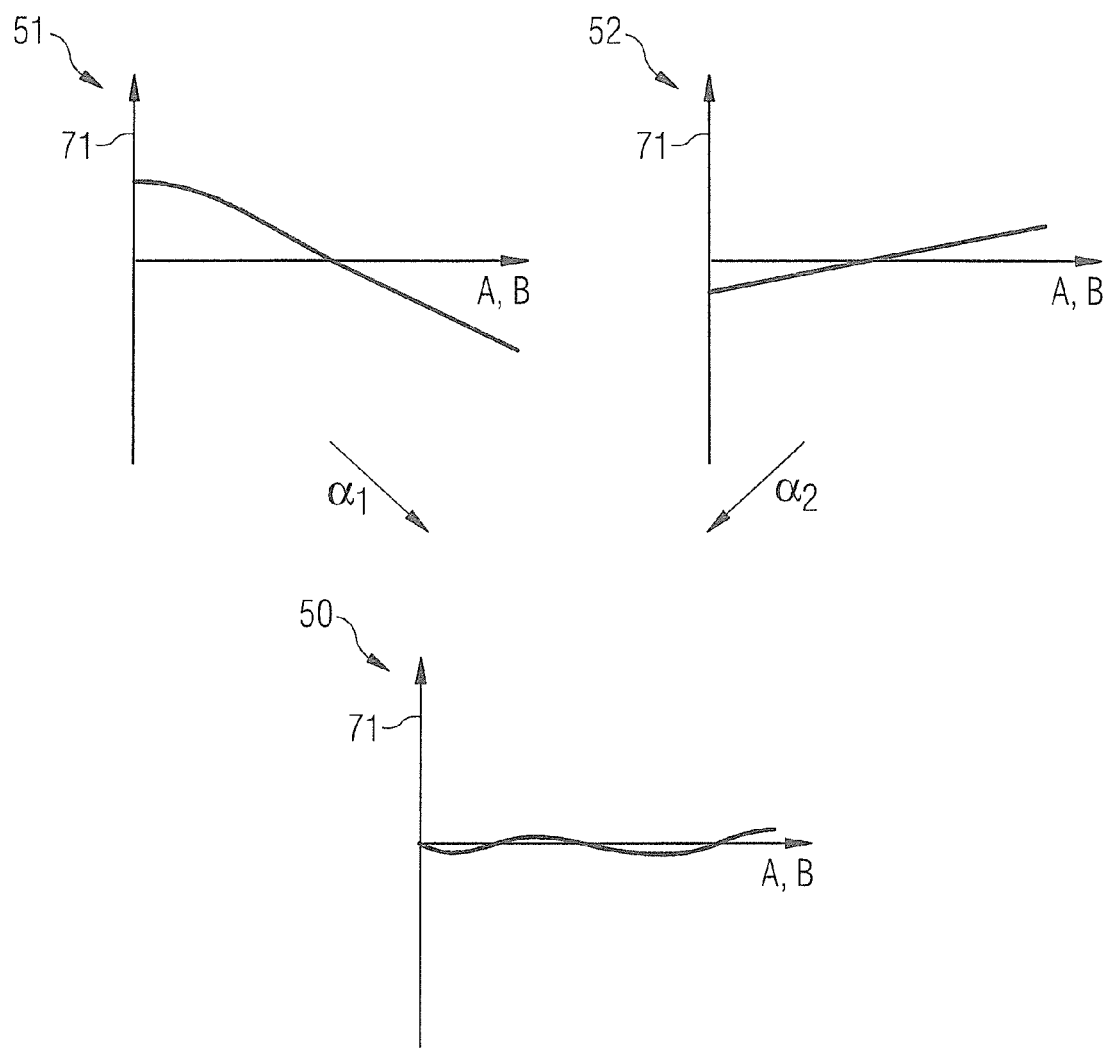

MAGNETIC RESONANCE METHOD AND APPARATUS FOR GENERATING AN IMAGE OF A SUBJECT WITH TWO SPIN SPECIES

BACKGROUND OF THE INVENTION

Field of the Invention

The invention concerns techniques to determine a magnetic resonance image of an examination subject with at least two spin species (types) by means of at least two approximative models that express an MR signal under consideration of various MR parameters.

Description of the Prior Art

Chemical shift imaging multi-echo magnetic resonance (MR) measurement sequences (for example Dixon-like measurement sequences) are helpful in many applications. Such techniques make use of the effect that the resonance frequency of the nuclear spins depends on the molecular or chemical environment. This is known as a chemical shift. For example, the difference between two resonance frequencies can be expressed in ppm ("parts per million", i.e. $10^{-6}$), and in particular independently of field strength. The chemical shift between nuclear spins in water and nuclear spins in fatty acid chains is frequently considered. Body fat is generally composed of multiple components with different chemical shifts, such that multiple resonance frequencies are obtained (what is known as the multispectral nature of fat). A spin species with a shift of approximately 3.4 ppm typically dominates. The MR signals of typical Dixon-like measurement sequences are therefore frequently reconstructed in a water MR image and a fat MR image, i.e. in individual MR images of the respective spin species.

Fat quantification by means of such multi-echo MR measurement sequences (and MR images obtained from these) is an increasingly important means in the diagnosis of the most varied illnesses, for instance fatty liver disease. A water image can serve as a replacement for conventional spectral fat suppression.

Inhomogeneities of the basic magnetic field of the MR system can also cause a shift of the resonance frequency, which can be at least partially compensated by special correction methods and/or more complicated multi-echo MR measurement sequences (for example with additional echoes). More comprehensive approximative models can also be used for signal analysis. Using additional MR signals, an estimate can also be obtained for the $T_2^*$ relaxation time that manifests in an echo time-dependent reduction of the signal strength. If $T_2^*$ is not taken into account, this can lead to a worsening of the water/fat separation. Conversely, the absence of consideration of the multispectral nature of the fat can lead to a worsening of the $T_2^*$ estimation.

$T_2^*$ can serve, for example, as a measure of an iron content, for example for diagnosis of hepatic iron storage illness. The same can similarly apply to additional MR parameters. MR images that describe $T_2^*$ can, for example, be acquired within the scope of what is known as relaxometry; in general, MR images that describe MR parameters are acquired within the scope of parametric imaging.

Different MR measurement sequences can be used for data acquisition: in general, such techniques can be implemented with every MR measurement sequence. Gradient echo (GRE) measurement sequences have proven to be particularly suitable.

For example, a comprehensive signal model for MR signals given multiple spin species (for example fat and water) is known from M. Bydder et al. in Magn. Reson. Imaging 26 (2008) 347-359; see for example Equation 5 of this publication. An expression for the MR signal is expressed there under consideration of multiple MR parameters. The MR parameters therefore serve as model parameters. The MR parameters include the resonance spectrum of the various spin species, the relaxation times of the various spin species (thus in particular T1 and $T_2^*$ relaxation times), inhomogeneities of the basic magnetic field etc., as well as the strength of the noise. Additional MR parameters can result from the measurement sequence that is used, for example the phase position of the individual echoes. The spin species themselves can be considered as MR parameters. Various approximative models are known to solve this equation. The approximative models express the MR signal in a simplified form relative to Equation 5. The MR parameters can thereby be considered only in part or, respectively, to a limited or, respectively, simplified extent. A quantitative determination of these MR parameters (in particular the clinically relevant fat/water quantification or $T_2^*$ determination as presented above) is then possible by means of the multi-echo MR measurement sequence.

In general, the following trend can be formulated: the more precise a solution of the cited Equation 5 that is sought—for example in that more MR parameters are taken into account as open variables and/or that individual MR parameters are precisely taken into account (for example a larger number of resonance peaks and so forth)—the more MR signals that are required. Otherwise, an approximative model can deliver only limited stable solutions, and an uncertainty of the solution increases, which can produce an intensified noise of the MR image, for example.

It can be worthwhile to use a relatively large number of different MR parameters. For this, it can be necessary to detect a comparably large number of MR signals. For example, the detection of six echoes at various echo times is known from US 2009/0261823 A1.

The large number of detected MR signals can have the disadvantage that an extended measurement duration can produce movement artifacts. This can in turn increase the uncertainty or the errors of the determined solutions.

Techniques are also known that allow a simplified determination of different MR parameters by means of defined approximative models. For this purpose, more or less wide-ranging simplifications are typically assumed, for example a lower number of MR parameters affecting the MR signal, constant or simpler MR parameters (for example a lower number of resonance peaks or resonance frequencies to be considered) and so forth. The parameter space or the number of unknown MR parameters can be reduced, and it can then be possible to implement a determination of the remaining MR parameters from a comparably lower number of MR signals. For example, for fat/water separation two-point and three-point techniques are known, thus techniques which take into account only two or three MR signals. These can be detected in a smaller amount of time and are suitable for (for example) examinations of the abdomen (in particular of the liver) during a breath-hold phase.

However, such severely simplified techniques can have the disadvantage that the quantitative determination of the MR parameters (in particular of the spin species) is comparably imprecise. For example, an overestimation or underestimation of the fat content can result, which can produce errors in a subsequent clinical application.

Therefore, there is a need for improved techniques to determine an MR image with at least two spin species by means of a chemical shift imaging multi-echo MR measurement sequence. In particular, here there is a need for techniques which allow a fast and simultaneously precise determination of the MR image.

SUMMARY OF THE INVENTION

According to one aspect of the invention, a method is provided to determine a magnetic resonance (MR) image of an examination subject with at least two spin species by means of a chemical shift imaging multi-echo MR measurement sequence. The method includes the acquisition of a predetermined number of MR signals with the multi-echo MR measurement sequence. The method furthermore includes the determination of a first approximated MR image (which approximates the MR image) from the MR signals and based on a first approximative model, and the determination of a second approximated MR image (which approximates the MR image) from the MR signals and based on a second approximative model. The first and second approximative models respectively express at least one of the predetermined number of MR signals under consideration of one or more MR parameters, and the first and second approximative models differ with regard to the consideration of at least one MR parameter. The method furthermore includes the determination of the MR image from a mean value calculation that takes into account the first and second approximated MR image.

For example, the acquisition of the predetermined number of MR signals can take place at respectively different echo times. For example, the first and second approximative model can thus take into account at least one different MR parameter and/or differently take into account at least one MR parameter. The consideration of an MR parameter can mean that the approximative model does not assume these MR parameters as hard set and determines these at least partially or to a limited extent based on the MR signals. The different consideration of an MR parameter can in turn designate the consideration by means of approximations. The consideration of different MR parameters can mean that one of the first and second approximative models assumes a defined MR parameter as variable (or, respectively, assumes them as not hard set), while the other approximative model assumes the defined MR parameter as hard-set.

For example, the MR image can describe and/or quantify an MR parameter. For example, the MR image can be indicative of an MR parameter. An image pixel of the MR image can, for example, have a value that describes the MR parameter. For example, a contrast of the MR image can be indicative of a value of an MR parameter. For example, the at least two spin species can be fat and water spin species. The contrast of the MR image can then be indicative of a local content of the fat spin species, for example. It is also possible that the contrast of the MR image is indicative of the T2* relaxation time.

It is also possible for the predetermined number of MR signals to be equal to two or three. This number can be established at the point in time of measurement, for example. Such a number of MR signals have the advantage that all MR signals can be detected within a comparably short time period. This can allow a particularly flexible adaptation to the breathing cycle of an examined person (as an examination subject), for example. Movement artifacts can be minimized. Such a comparably low number of MR signals thus have the advantage that a time period required for implementation of the MR measurement sequence is comparably small, for example in particular relative to techniques which detect a larger number of MR signals. For example, it can be possible to detect MR signals for larger regions or for a greater number of positional frequency space sampling points in an imaging manner during the same time periods (for example a breath-hold phase).

In general, there are no particular requirements for the multi-echo MR measurement sequence. A variety of MR measurement sequences can be used as are known to those skilled in the art. Dixon-like MR measurement sequences in particular can be used. It is possible to implement the multi-echo MR measurement sequence with the most varied k-space trajectories for scanning k-space (positional frequency space). Particular influences of the k-space trajectory that is used on the MR signal can possibly be taken into account. For example, the readout of successive MR signals with readout gradients of different polarity can be expressed in additional signal phases. A discussion of various k-space trajectories in connection with multi-echo MR measurement sequences is available from Saranathan M. et al., in Proc. Int. Soc. Mag. (2011) 2941, for example.

For example, the MR parameters can be selected from the following group: local content of the various spin species; T2* relaxation time of the various spin species; T1 relaxation time of the various spin species; resonance spectrum of a spin species; inhomogeneities of a basic magnetic field.

The local content of a spin species can, for example, designate a percentile share of this spin species in the complete signal of an MR image point (voxel). The local content can thus designate a concentration of the spin species in the voxel.

Various embodiments which pertain to specific approximative models are discussed in the following. Approximative models which allow a consideration of the various combinations or, respectively, a different consideration of the various MR parameters are known to those skilled in the art. In particular, these approximative models can also have a dependency on the considered spin species—this is the case since the various MR parameters can depend on the spin species. For example, the resonance spectrum can be characteristic of different spin species.

In the following, an exemplary listing of various approximative models is provided, which is not to be construed as limiting. In principle, according to the invention every approximative model can namely be used to determine one of the approximated MR images. Approximative models are known from, among other things:

J. Ma "Breath-hold water and fat imaging using a dual-echo two-point Dixon technique with an efficient and robust phase-correction algorithm" in Mag. Reson. Med. 52 (2004) 415-419;

G. H. Glover et al., "Three-point Dixon technique for true water/fat decomposition with BO inhomogeneity correction" in Mag. Reson. Med. 18 (1991) 371-383;

T. E. Skinner et al., "An extended two-point Dixon algorithm for calculating separate water, fat, and BO images" in Mag. Reson. Med. 37 (1997) 628-630, W. T. Dixon, "Simple proton spectroscopic imaging" in Radiology 153 (1984), 189-194.

Meisamy et al. "Quantification of Hepatic Steatosis with T1-independent, T2*-corrected MR Imaging with Spectral Modeling of Fat: Blinded Comparison with MR Spectroscopy", in Radiology 258 (2011), 767

Liu et al. "Fat Quantification With IDEAL Gradient Echo Imaging: Correction of Bias From T1 and Noise" in Magn. Reson. Med. 58 (2007), 354

V. Jellus "Phase correction method" U.S. Pat. No. 7,888,936.

It should be understood that the approximative model can be selected depending on the number of MR signals that is established at the point in time of measurement—or, respectively, after the measurement can access only this (limited) data store. This can include simplifications. Typical simplifications of such approximative models are:

- only one fat spin species and one water spin species exist, and their resonance peaks are separated in frequency space by a value of 3.4 ppm;
- a fixed spectral model of the fat (in contrast to a model with variable amplitudes for the spectral portion of the fat);
- no time dependency on inhomogeneities of the basic magnetic field;
- low spatial dependency of the inhomogeneities of the basic magnetic field;
- the primary effect that leads to the mixing of the MR signals of the fat spin species and water spin species is T2* relaxation time.

For example, the significant MR parameters for the implementation of robust water/fat separation can be the water and fat content in mixed voxels (three-dimensional (3D)) image points of the MR signal acquisition) and a background phase of the inhomogeneities of the basic magnetic field. Conventional approximative models can therefore commonly use three-point MR signal acquisition (i.e. the predetermined number of detected MR signals is equal to 3). For example, given the simplified assumption that the background phase of the basic magnetic field depends only slightly on the location (i.e. varies slowly in space), a compensation of this MR parameter can be implemented even given only two detected MR signals. However, in such a case it can be necessary to determine which of the two separate components belongs to water and fat. Limitations can exist with regard to a phase correction algorithm given strong local gradients. Nevertheless, various approximative models can use two detected MR signals (two-point measurement sequence), typically with a 180° phase difference of the two spin species (fat and water). Moreover, modern phase correction techniques exist which allow chemical shift imaging with only one detected MR signal, wherein a determination of the content of the various spin species in mixed voxels (i.e. voxels that include both the fat spin species and the water spin species) is possible only with a low precision, however. Namely, a separation of the spin species can namely be implemented with a single MR signal only under idealized conditions, i.e. pure water spin species and pure fat spin species in a voxel: voxels with 0° phase are then, for example, voxels which have 100% content of the water spin species, and voxels with 180° phase are voxels which have 100% content of the fat spin species.

For example, the resonance spectrum can be the resonance spectrum of a fat spin species. It is possible that the corresponding approximative model takes into account the resonance spectrum of the fat spin species with a different number of resonance peaks.

In particular the MR image can be indicative of at least a local content of a fat spin species and/or of a local content of a water spin species and/or of one of the MR parameters and/or of one of the at least two spin species. For example, the MR image can have a corresponding contrast (for example color or greyscale coding). The MR image can also be designated as an MR parameter map that reflects an MR parameter with spatial resolution. This can also be designated as a parametric MR imaging. This can allow subsequent and separate applications to be implemented based on the MR image.

The first and second approximative models can respectively take into account a single resonance peak of the water spin species, and the first and second approximative model can respectively be selected from the following group: two-point estimation with a single resonance peak of the fat spin species; two-point estimation with consideration of multiple resonance peaks of the fat spin species; three-point estimation with consideration of the T2* relaxation time of at least one spin species; three-point estimation with consideration of the T2* relaxation time of at least one spin species and multiple resonance peaks of the fat spin species; three-point estimation with consideration of the T2* relaxation time and the T1 relaxation time of at least one spin species.

For example, the two-point estimation with consideration of multiple resonance peaks of the fat spin species can be with a fixed spectral model of the fat spin species.

For example, the three-point estimation with consideration of the T2* relaxation time of at least one spin species can assume a common T2* relaxation time.

For example, it can be possible to consider the same T2* relaxation time for a fat spin species and a water spin species. However, it is also possible to take into account different T2* relaxation times.

In a preferred embodiment, the first approximative model can be the three-point estimation with consideration of the T2* relaxation time of at least one spin species, and the second approximative model can be the three-point estimation with consideration of the T2* relaxation time of at least one spin species and multiple resonance peaks of the fat spin species. For example, it can be possible that the first approximative model overestimates (underestimates) the local content of the fat spin species while the second approximative model underestimates (overestimates) this content.

The predetermined number of MR signals can be greater than two, and at least one of the first and second approximative models can be taken into account only a fraction of the detected MR signals. For example, three MR signals can be detected, and the first approximative model can consider all three MR signals while the second approximative model can consider only two of the three MR signals. In other words: it is not necessary that the approximative models consider all detected MR signals. It is generally possible to detect more MR signals than are considered by at least one approximative model.

A number of suitable MR measurement sequences and a number of suitable approximative models are thus known to those skilled in the art, and there is no need to cite further details in this regard. It should be understood that the implementation of the MR measurement sequence and the application and implementation of the various approximative models to determine the first and second approximated MR image are known to the man skilled in the art. Therefore, it is also possible to use the most varied approximative models to determine the approximated MR images.

In the preceding, reference is predominantly made to techniques in connection with the MR measurement sequences and the approximative models. Reference is predominantly made in the following to the determination of the MR image from the mean calculation.

For example, the mean calculation can take weighting factors into account. It can then be possible to take results of the first and second approximative model (thus the approximated MRT images) into account with different significance. This can allow an increased precision in the determination of the MR image. For example, it is possible that the weighting factors are hard-set.

The method can also include the determination of the weighting factors based on the first approximated MR image and/or the second approximated MR image. For example, it can be possible to determine the weighting factors based on a work point: for example, if the first approximated MR image and/or the second approximated MR image indicates a determined value of an MR parameter, for example in a threshold comparison, it can thus be possible to determine the weighting factors depending on this. For example, the weighting factors for a high fat content (as it is determined from the first and/or second approximated MR image) can be chosen to be different relative to the case of a low fat content. This is qualitatively and quantitatively purely illustrative, and the same accordingly applies to other MR parameters, for example in particular the local content of the water spin species and/or the T2* relaxation time.

In other words: the weighting factors can be hard-set based on defined experimental values or static analyses etc. depending on the work point (i.e. depending on the approximated MR images themselves), or can be determined depending on the approximated MR images. For example, it can be known that a defined approximative model always overestimates or underestimates the fat content given high fat contents, while a different approximative model overestimates or underestimates a T2* relaxation time. The weighting factors can be determined in light of such criteria. It should be understood that these dependencies vary significantly with the specific selection of the approximative models.

It is also possible that the weighting factors are spatially dependent. For example, it is in particular possible that the determination of the weighting factors occurs with spatial dependency. For example, it can be possible to take different approximative models into account with different significance depending on the work point. For example, if the first approximative model indicates a particularly advantageous embodiment high (low) fat content at a location, at this location the weighting factor for the second approximative model can be selected to be particularly low (high)—such dependencies are purely illustrative and are not to be construed as limiting. In general, the mean calculation can take into account different and spatially resolved weighting factors depending on the spatially resolved result of one of the approximative models.

In the preceding, reference was made predominantly to the determination of a first and second approximated MR image. However, it is in general possible to take into account more than two approximative models, i.e. to determine more than two approximate MR images. This is explained in the following.

Furthermore, the method can include the determination of at least one further approximated MR image (that respectively approximates the MR image) from the MR signals, and respectively based on a further approximative model, wherein the at least one further approximative model respectively expresses at least one of the predetermined number of MR signals under consideration of one or more MR parameters, and wherein each of the at least one further approximative models differs from the other approximative models with regard to the consideration of at least one MR parameter.

According to a further aspect, the invention concerns a magnetic resonance system that is operable to determine an MR image of an examination subject with at least two spin species by means of a chemical shift imaging multi-echo MR measurement sequence. The MR system has a receiver unit that is configured to detect a predetermined number of MR signals with the multi-echo MR measurement sequence. The MR system furthermore has a computer that is configured to implement the following steps: determine a first approximated MR image (which approximates the MR image) from the MR signals and based on a first approximative model; determine a second approximated MR image (which approximates the MR image) from the MR signals and based on a second approximative model, wherein the first and second approximative model respectively express at least one of the predetermined number of MR signals under consideration of one or more MR parameters, and wherein the first and second approximative model differ with regard to the consideration of at least one MR parameter; and determine the MR image from a mean calculation that takes into account the first and second approximated MR image.

With such an MR system, results can be achieved that are comparable to those achieved by the method to determine the MR image according to the invention.

The features of the embodiments and aspects of the invention that are described in the preceding can naturally be combined with one another. The features can in particular be used not only in the described combinations, but rather also in other combinations or independently without departing from the scope of the invention.

BRIEF DESCRIPTION OF THE DRAWINGS

FIG. 1 schematically illustrates view of an MR system that is suitable for implementation of techniques according to the invention.

FIG. 2 is a flowchart of a method according to the invention for determination of an MR image.

FIG. 3 schematically illustrates approximated MR images, and the MR image determined therefrom.

FIG. 4 illustrates schematic errors of the approximated MR images and errors of the MR image determined therefrom.

DESCRIPTION OF THE PREFERRED EMBODIMENTS

FIG. 1 schematically shows a magnetic resonance (MR) system 230 according to one embodiment of the present invention. The MR system 230 has a magnet 210 to generate a basic magnetic field. For example, the magnet 210 can be a tube magnet and the basic magnetic field can be situated parallel to the longitudinal axis (axial direction A) of the tube 209. The basic magnetic field is used to align nuclear spins in the examination subject 211. A constant basic magnetic field is ideally used. However, it can be possible that the basic magnetic field exhibits spatial inhomogeneities due to technical limitations of the magnet 210 and/or susceptibility artifacts.

An examination subject (here an examined person 211) can be slid on a bed table 213 into the magnet 210. The bed table 213 can be positioned (what is known as table feed) in particular along the axial direction A, and possibly also—within geometric limitations—along directions orthogonal to this (radial direction B). A slice 62 of the examination subject 211 is illustrated. Given table feed, the position of the slice 62 moves in the axial direction A within the tube 209.

The MR system 230 furthermore has a gradient system 214 to generate magnetic field gradients that are used for the imaging and for spatial coding of acquired MR data. The gradient system 214 typically comprises at least three separately controllable coils or coil sets which enable gradient fields to be applied and switched along defined spatial directions (gradient axes). The corresponding coils are designated as channels of the gradient system 214 (slice selection, phase selection, frequency selection). The corresponding techniques are known to the man skilled in the art.

To excite the polarization or alignment of the spin magnetization that results in the basic magnetic field, a radio-frequency (RF) coil arrangement 215 is provided that can radiate an amplitude-modulated RF excitation pulse into the examined person 211 in order to deflect the magnetization out of the steady state (typically parallel to the basic magnetic field), i.e. to generate a transversal magnetization. A radio-frequency generator 220 and an amplitude modulation unit 224 are used to generate such RF excitation pulses. A gradient unit 23 is provided to control the gradient system 214. The units 220, 223 and 224 can in particular be operated as a transmitter system 226 for targeted excitation of the transversal magnetization. A computer 222 of a receiver system 225 receives signals of the relaxing transversal magnetization, what are known as MR signals. For this the computer 222 is coupled with RF reception coils. In a particularly simple embodiment, the RF coil 215 is used both to transmit and receive. However, separate RF transmission coils and RF reception coils can be used.

For example, the units 225, 226 can implement a multi-echo MR measurement sequence in which multiple MR signals of the slice 62 are acquired. For example, 2 or 3 or more MR signals can be detected. The most varied suitable measurement sequences are known to the man skilled in the art.

An operating unit 212 allows the input and output of and to a user of the MR system 230. The operating unit 212 can, for example, comprise a monitor, a keyboard, a mouse, storage media, data connections and so forth.

Furthermore, a computer 227 is provided which allows different evaluations to be implemented based on the detected MR signals, for example within the scope of chemical shift imaging techniques.

The units of the MR system 230 are presented and discussed separately in FIG. 1. However, specific units can be combined and/or functionally integrated, for example as hardware and/or software. For example, this can in particular concern the computer 227 which, for example, can be part of a central computer of the MR system 230.

A method according to the invention, which includes chemical shift imaging and can be implemented by the computer 227, is illustrated by means of a flow diagram in FIG. 2.

The method begins with Step S1. Three MR signals are initially detected in Step S2 with a multi-echo MR measurement sequence. Alternatively, it would be possible to detect two or four or more MR signals. The most varied multi-echo MR measurement sequences known to those skilled in the art can be used, in particular the aforementioned 3d VIBE and 2d TSE techniques. Different k-space trajectories for scanning k-space can also be used.

The three MR signals are detected at respective different echo times, which produce different phase positions of the various spin species. Step S2 can be implemented by means of the receiver unit 222 of the MR system 230.

The detected MR signals can generally be formulated as:

$$S(t) = \sum_{j=1}^{n} S_j \cdot \exp(i\omega_j t) \cdot \exp(-v_j^* t) \cdot \exp(i\psi t) \cdot \exp(i\varphi)$$

See in this regard Equation 5 from M. Bydder et al. in Magn. Reson. Imag. 26 (2008) 347-359. S is hereby the MR signal as a function of time t; j indicates different spin species. For example, j=2 can be the case for a fat and water spin species.

The MR signal is dependent on a series of MR parameters: Sj is the signal of the different spin species in a steady state and depending on imaging parameters, as well as the T1 relaxation time; $\omega j$ is the chemical shift of the spin species j, thus describes a resonance spectrum with one or more resonance peaks; $v^*_j$ is an R2* relaxation rate of the spin species j, wherein $R2^*=T2^{*-1}$; $\psi$ is a field map of the basic magnetic field and therefore in particular concerns inhomogeneities of the basic magnetic field; and $\varphi$ is a phase offset.

The aforementioned equation is comparably complicated and in particular includes a large parameter space, thus many MR parameters. If all cited MR parameters were assessed as unknown, a large number of MR signals would be required in order to determine these. However, approximative models are known which—via specific simplifications or, respectively, model assumptions, for example predetermined or, respectively, constant MR parameters or particularly simple selection of specific MR parameters—can solve the correspondingly simplified equation. The approximative models therefore allow a comparably simpler determination of approximative MR images that are indicative of one or more of the MR parameters.

In particular, by means of the approximative models it can be possible to use only a comparably low number (three, in the present case) of MR signals in order to determine MR parameters. The more free MR parameters that are to be determined, the more MR signals that must be used in general. Such an approximative model is selected in Step S3, and in Step S4 an approximative MR image is determined from the detected MR signals and based on the approximative model. In preferred embodiments, this occurs in particular for the fat spin species and the water spin species, but this can generally occur for arbitrary spin species.

For example, typical approximative models can take into account an individual resonance peak of the water spin species. However, specific approximative models can take into account multiple resonance peaks of the fat spin species. For example, the different approximative models can take into account three or two MR signals (three-point estimation or, respectively, two-point estimation). It is not necessary to account for all three detected MR signals. For example, approximative models are known which take into account a single resonance peak of the fat spin species and the water spin species that are shifted counter to one another by 3.4 ppm. These approximative models can be extended [sic] the consideration of multiple resonance peaks of the fat spin species, i.e. take into account what is known as the multi-spectral nature of the fat spin species. For example, three-point estimations can moreover take into account the T2* relaxation time of at least one of the spin species; for example, one and the same T2* relaxation time can be considered for the fat spin species and the water spin species. It is also possible to consider both the T2* relaxation time and multiple resonance peaks of the fat spin species. In three-point estimations, it is also possible to consider the T1 relaxation time of at least one spin species. For example, it is possible to differently consider the T1 relaxation time for the fat spin species and the water spin species, wherein the T1 relaxation time for fat can be selected to be characteristic of the imaged slice 62, for example—the T1 relaxation time for the fat spin species can be chosen to be identical to a typical T1 relaxation time in the liver of the examined person 211, for example. In general, a T1 relaxation time of fat can namely be different for the chemical structure of the fat and therefore assume different values for the liver (for example) than for other organs.

A first approximated MR image 51 and a second approximated MR image 52 (for example for the slice 62 of the examined person 211) are shown in FIG. 3; the approximated MR images 51, 52 are respectively indicative of the fat content 70. The fat content 70 has a spatial dependency. For example, it would be possible to output an MR image by means of the user interface 212, the contrast of which is indicative of the fat content 70. For example, it would be possible that the MR image is coded in grey levels (0% fat content=white; 100% fat content=black).

Referring again to FIG. 2: in Step S5 a check is made as to whether an additional approximated MR image is required, and if so Steps S3 and S4 are implemented again. For example, the number and type of approximated MR images can be hard-set. It is also possible to make the decision in Step 55 depending on the already determined approximated MR images. For example, a decision can be made in Step 55 depending on a value of the MR parameters 70.

Otherwise, in Step S6 the MR image is determined from mean calculation of the approximated MR images as they are determined in the respective Step S4. This is illustrated in FIG. 3, where the MR image 50 is represented as a mean calculation of the fat content values of the approximated MR images 51, 52.

Referring again to FIG. 2: Step S6 can optionally also include the determination of weighting factors $\alpha_1$, $\alpha_2$ for the mean calculation. For example, the determination of the weighting factors $\alpha_1$, $\alpha_2$ can occur based on one or more of the approximated MR images 51, 52. For example, the determination of the weighting factors $\alpha_1$, $\alpha_2$ can include a threshold comparison. For example, the threshold comparison can compare an averaged value of at least one MR parameter 70 with reference values, and it can then be possible to determine the weighting factors $\alpha_1$, $\alpha_2$ depending on the threshold comparison. It is also possible that the weighting factors $\alpha_1$, $\alpha_2$ are determined with spatial resolution; for example, this can include a spatially resolved implementation of the threshold comparison. As an example, and referring to FIG. 3, different weighting factors $\alpha_1$, $\alpha_2$ can be considered for the mean calculation between the approximated MR images 51, 52 (for example depending on the local fat content 70). For example, a first (second) weighting factor $\alpha_1$ for the first approximative model could be used for fat contents 70 greater than (less than) 50%.

In general, the weighting factors $\alpha_1$, $\alpha_2$ for the first and second approximative models can be selected so that their sum is one. It is possible that the weighting factors $\alpha_1$, $\alpha_2$ are selected from the set (0, 1). It is also possible that the weighting factors are greater than 1 or less than 0. In a particularly simple embodiment, the weighting factors can also be equal (for example equal to 1).

Referring again to FIG. 2: Step S2 can, for example, be implemented by the receiver unit 225, and Steps S3-S5 can be implemented by the computer 227, for example. The method ends in Step S7.

Errors 71 for MR parameters 40 are respectively presented in FIG. 4 for the first approximated MR image 51 and the second approximated MR image 52. The errors result relative to the actual values of the MR parameter 70, for example as they are known for reference phantom objects.

As is clear above from FIG. 4, the first (second) approximative model can supply values of the MR parameter 70 which are greater than (smaller than) the actual value of the MR parameter 70. In other words, for example, the first approximative model can overestimate the value of the MR parameter 70, while the second approximative model can underestimate the value of the MR parameter. The MR image 50 which has no (or only a small) error 71 of the MR parameter 70 can be determined via the weighted mean calculation. This is illustrated as mentioned below in FIG. 4.

The graphs of FIG. 4 are the result of a simulation, wherein the first approximative model is the three-point estimation with consideration of the T2* relaxation time of the fat and water spin species, and wherein the second approximative model is the three-point estimation with consideration of the T2* relaxation time of the fat and water spin species, and multiple resonance peaks of the fat spin species are considered (multispectral nature of the fat). The weighting factors can be equal to 1.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to generate a magnetic resonance (MR) image, comprising:
   operating an MR data acquisition unit, with an examination subject therein comprising at least two spin species, to execute a chemical shift imaging multi-echo MR data acquisition sequence in which a predetermined number of MR signals are detected;
   in a processor, generating a first approximative model, for one of said at least two spin species, that expresses at least one of said predetermined number of MR signals dependent on at least one MR parameter, and generating a second approximative model that expresses at least one of said predetermined number of MR signals dependent on at least one MR parameter, said first and second approximative models differing with regard to the at least one MR parameter that is used to generate the respective approximative model;
   in said processor, automatically determining a first approximated MR image, that approximates an MR image to be generated, from the detected MR signals, using said first approximative models;
   in said processor, automatically determining a second approximated MR image, for said one of said at least two spins species, that approximates said MR image to be generated, from the detected MR signals, using said second approximative models; and
   in said processor, generating said MR image to be generated by executing a mean value calculation using said first and second approximated MR images, and making the determined MR image available in electronic form as a data file at an output of said processor.

2. A method as claimed in claim 1 comprising selecting said at least one MR parameter from the group consisting of a local content of said at least two spin species, a T2* relaxation time of said at least two spin species, a T1 relaxation time of said at least two spin species, a resonance spectrum of said at least two spin species, an inhomogeneities in a basic magnetic field generated in said MR data acquisition unit during execution of said chemical shift imaging multi-echo MR data acquisition sequence.

3. A method as claimed in claim 1 wherein said at least two spin species include, as one of said species, fat spins, said fat spins exhibiting a resonance spectrum comprising a plurality of resonance peaks, and comprising determining said first and second approximative models respectively using different numbers of said resonance peaks of said resonance spectrum of said fat spins.

4. A method as claimed in claim 3 wherein said at least two spin species include, at one of said spin species, water spins, and comprising generating said MR image to visually represent at least one of a local content of fat spins, a local content of water spins, a local content of one of said MR parameters, and a local content of one of said at least two spin species.

5. A method as claimed in claim 4 wherein said water spins exhibit a water spin resonance spectrum comprising a plurality of resonance peaks, and wherein said method comprises:
generating each of said first and second approximative models dependent on a single resonance peak of said resonance spectrum of said water spins; and
determining said first and second approximative models as models selected from the group consisting of a model generated with a two-point estimation of a single resonance peak in said resonance spectrum of said fat spins, a model generated with a two-point estimation with multiple resonance peaks of said resonance spectrum of said fat spins, a model generated with a three-point estimation dependent on a T2* relaxation time of at least one of said spin species, a model generated with a three-point estimation dependent on a T2* relaxation time of at least one of said spin species and multiple resonance peaks of said resonance spectrum of said fat spins, and a model generated with a three-point estimation of a T2* relaxation time and a T1 relaxation time of at least one of said spin species.

6. A method as claimed in claim 5 comprising generating said first approximative model using said three-point estimation with said T2* relaxation time of said at least one of said spin species, and generating said second approximative model as said three-point estimation with said T2* relaxation time of said at least one of said spin species and multiple resonance peaks of the resonance spectrum of the fat spins.

7. A method as claimed in claim 1 comprising operating said MR data acquisition unit to acquire said predetermined number of MR signals as being two MR signals or three MR signals.

8. A method as claimed in claim 1 comprising operating said MR data acquisition unit to acquire said predetermined number of MR signals as being greater than two MR signals, and comprising determining at least one of said first and second approximative models based only on fewer than all of the predetermined number of detected MR signals.

9. A method as claimed in claim 1 comprising respectively weighting said first and second approximated MR images with different weighting factors in said mean value calculation.

10. A method as claimed in claim 9 comprising determining said weighting factors in said processor based on at least one of said first approximated MR image and said second approximated MR image.

11. A method as claimed in claim 9 comprising in plane spatially dependent weighting factors as said weighting factors in said mean value calculation.

12. A method as claimed in claim 1 comprising:
in said processor, automatically determining at least one further approximated MR image, that approximates said MR image to be generated, from said predetermined number of acquired MR signals, based on the further approximative model;
determining said further approximative model in said processor to express at least one of said predetermined number of acquired MR signals dependent on at least one MR parameter that differs from the at least one MR parameter used to determine each of said first and second approximative models; and
executing said mean value calculation using said first approximated MR image, said second approximated MR image, and said at least one further approximated MR image.

13. A magnetic resonance (MR) system, comprising:
an MR data acquisition unit;
a control unit configured to operate said MR data acquisition unit, with an examination subject therein comprising at least two spin species, to execute a chemical shift imaging multi-echo MR data acquisition sequence in which a predetermined number of MR signals are detected;
a processor configured to generate a first approximative model, for one of said at least two spin species, that expresses at least one of said predetermined number of MR signals dependent on at least one MR parameter, and generating a second approximative model that expresses at least one of said predetermined number of MR signals dependent on at least one MR parameter, said first and second approximative models differing with regard to the at least one MR parameter that is used to generate the respective approximative model;
said processor being configured to automatically determine a first approximated MR image, that approximates an MR image to be generated, from the detected MR signals, using said first approximative models;
said processor being configured to automatically determine a second approximated MR image, for said one of said at least two spins species, that approximates said MR image to be generated, from the detected MR signals, using said second approximative models; and
said processor being configured to generate said MR image to be generated by executing a mean value calculation using said first and second approximated MR images, and to make the determined MR image available in electronic form as a data file at an output of said processor.

* * * * *